United States Patent
Norman et al.

(10) Patent No.: US 11,508,693 B2
(45) Date of Patent: Nov. 22, 2022

(54) HIGH CAPACITY MEMORY MODULE INCLUDING WAFER-SECTION MEMORY CIRCUIT

(71) Applicant: SUNRISE MEMORY CORPORATION, Fremont, CA (US)

(72) Inventors: Robert D. Norman, Pendleton, OR (US); Richard S. Chernicoff, Mercer Island, WA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/124,194

(22) Filed: Dec. 16, 2020

(65) Prior Publication Data

US 2021/0265308 A1    Aug. 26, 2021

Related U.S. Application Data

(60) Provisional application No. 62/980,592, filed on Feb. 24, 2020.

(51) Int. Cl.
*H01L 25/065*    (2006.01)
*H01L 25/18*     (2006.01)

(52) U.S. Cl.
CPC .......... *H01L 25/0652* (2013.01); *H01L 25/18* (2013.01); *H01L 2225/06513* (2013.01);
(Continued)

(58) Field of Classification Search
CPC ... H01L 25/065; H01L 25/0652; H01L 25/18; H01L 25/0657
See application file for complete search history.

(56) References Cited

U.S. PATENT DOCUMENTS

| 4,213,139 A | 7/1980 | Rao |
| 5,583,808 A | 12/1996 | Brahmbhatt |

(Continued)

FOREIGN PATENT DOCUMENTS

| JP | 2010108522 A1 | 5/2010 |
| JP | 2011028540 A1 | 2/2011 |

(Continued)

OTHER PUBLICATIONS

"EP Extended Search Report EP168690149.3", dated Oct. 18, 2019.
(Continued)

*Primary Examiner* — Phat X Cao
*Assistant Examiner* — William H Anderson

(57) ABSTRACT

A memory device includes a first semiconductor wafer portion including two or more adjacent quasi-volatile memory circuits formed on a common semiconductor substrate where each quasi-volatile memory circuit being isolated from an adjacent quasi-volatile memory circuit by scribe lines; and a second semiconductor wafer portion including at least one memory controller circuit formed on a semiconductor substrate. The memory controller circuit includes logic circuits and interface circuits. The memory controller circuit is interconnected to the two or more adjacent quasi-volatile memory circuits of the first semiconductor wafer portion through interconnect structures and the memory controller circuit operates the two or more quasi-volatile memory circuits as one or more quasi-volatile memories.

20 Claims, 9 Drawing Sheets

(52) U.S. Cl.
CPC ............... *H01L 2225/06517* (2013.01); *H01L 2225/06541* (2013.01); *H01L 2225/06548* (2013.01)

(56) References Cited

U.S. PATENT DOCUMENTS

| | | | |
|---|---|---|---|
| 5,646,886 | A | 7/1997 | Brahmbhatt |
| 5,768,192 | A | 6/1998 | Eitan |
| 5,789,776 | A | 8/1998 | Lancaster et al. |
| 5,915,167 | A | 6/1999 | Leedy |
| 6,040,605 | A | 3/2000 | Sano et al. |
| 6,130,838 | A | 10/2000 | Kim et al. |
| 6,314,046 | B1 | 11/2001 | Kamiya et al. |
| 6,434,053 | B1 | 8/2002 | Fujiwara |
| 6,580,124 | B1 | 6/2003 | Cleeves et al. |
| 6,744,094 | B2 | 6/2004 | Forbes |
| 6,774,458 | B2 | 8/2004 | Fricke et al. |
| 6,873,004 | B1 | 3/2005 | Han et al. |
| 6,946,703 | B2 | 9/2005 | Ryu et al. |
| 7,005,350 | B2 | 2/2006 | Walker et al. |
| 7,284,226 | B1 * | 10/2007 | Kondapalli ........ H01L 27/11898 257/E27.11 |
| 7,307,308 | B2 | 12/2007 | Lee |
| 7,612,411 | B2 | 11/2009 | Walker |
| 8,026,521 | B1 | 9/2011 | Or-Bach et al. |
| 8,178,396 | B2 | 5/2012 | Sinha et al. |
| 8,630,114 | B2 | 1/2014 | Lue |
| 8,653,672 | B2 * | 2/2014 | Leedy ............... H01L 27/10897 257/777 |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,190,293 | B2 | 11/2015 | Wang et al. |
| 9,412,752 | B1 | 8/2016 | Yeh et al. |
| 9,748,172 | B2 | 8/2017 | Takaki |
| 9,799,761 | B2 | 10/2017 | Or-Bach et al. |
| 9,842,651 | B2 | 12/2017 | Harari |
| 9,892,800 | B2 | 2/2018 | Harari |
| 9,911,497 | B1 | 3/2018 | Harari |
| 10,074,667 | B1 | 9/2018 | Higashi |
| 10,096,364 | B2 | 10/2018 | Harari |
| 10,121,553 | B2 | 11/2018 | Harari |
| 10,249,370 | B2 | 4/2019 | Harari |
| 10,254,968 | B1 | 4/2019 | Gazit et al. |
| 10,283,493 | B1 | 5/2019 | Nishida |
| 10,319,696 | B1 * | 6/2019 | Nakano .................. H01L 24/80 |
| 10,381,370 | B2 | 8/2019 | Shin et al. |
| 10,381,378 | B1 | 8/2019 | Harari |
| 10,395,737 | B2 | 8/2019 | Harari |
| 10,431,596 | B2 | 10/2019 | Herner et al. |
| 10,475,812 | B2 | 11/2019 | Harari |
| 10,622,377 | B2 | 4/2020 | Harari et al. |
| 10,692,837 | B1 * | 6/2020 | Kim ..................... H01L 25/0652 |
| 2001/0030340 | A1 | 10/2001 | Fujiwara |
| 2001/0053092 | A1 | 12/2001 | Kosaka et al. |
| 2002/0051378 | A1 | 5/2002 | Ohsawa |
| 2002/0193484 | A1 | 12/2002 | Albee |
| 2004/0214387 | A1 | 10/2004 | Madurawe et al. |
| 2004/0246807 | A1 | 12/2004 | Lee |
| 2004/0262772 | A1 | 12/2004 | Ramanathan et al. |
| 2005/0128815 | A1 | 6/2005 | Ishikawa et al. |
| 2006/0155921 | A1 | 7/2006 | Gorobets et al. |
| 2008/0239812 | A1 | 10/2008 | Naofumi et al. |
| 2008/0301359 | A1 | 12/2008 | Smith |
| 2009/0157946 | A1 | 6/2009 | Arya |
| 2009/0237996 | A1 | 9/2009 | Kirsch et al. |
| 2009/0279360 | A1 | 11/2009 | Peter et al. |
| 2009/0290442 | A1 | 11/2009 | Rajan |
| 2009/0316487 | A1 | 12/2009 | Lee et al. |
| 2010/0121994 | A1 | 5/2010 | Kim et al. |
| 2010/0124116 | A1 | 5/2010 | Takashi et al. |
| 2010/0128509 | A1 | 5/2010 | Kim et al. |
| 2011/0044113 | A1 | 2/2011 | Kim |
| 2011/0134705 | A1 | 6/2011 | Jones et al. |
| 2011/0170266 | A1 | 7/2011 | Haensch et al. |
| 2011/0208905 | A1 | 8/2011 | Shaeffer et al. |
| 2011/0298013 | A1 | 12/2011 | Hwang et al. |
| 2011/0310683 | A1 | 12/2011 | Gorobets |
| 2012/0182801 | A1 | 7/2012 | Lue |
| 2012/0243314 | A1 | 9/2012 | Takashi |
| 2013/0031325 | A1 | 1/2013 | Nakamoto et al. |
| 2013/0256780 | A1 | 10/2013 | Kai et al. |
| 2014/0040698 | A1 | 2/2014 | Loh et al. |
| 2014/0075135 | A1 | 3/2014 | Choi et al. |
| 2014/0117366 | A1 | 5/2014 | Saitoh |
| 2014/0151774 | A1 | 6/2014 | Rhie |
| 2014/0229131 | A1 | 8/2014 | Cohen et al. |
| 2014/0328128 | A1 | 11/2014 | Louie et al. |
| 2014/0340952 | A1 | 11/2014 | Ramaswamy et al. |
| 2015/0098272 | A1 | 4/2015 | Kasolra et al. |
| 2015/0113214 | A1 | 4/2015 | Sutardja |
| 2015/0155876 | A1 * | 6/2015 | Jayasena ............... G11C 7/1006 326/39 |
| 2015/0194440 | A1 | 7/2015 | Noh et al. |
| 2015/0263005 | A1 | 9/2015 | Zhao et al. |
| 2016/0013156 | A1 | 1/2016 | Zhai et al. |
| 2016/0019951 | A1 | 1/2016 | Park et al. |
| 2016/0035711 | A1 | 2/2016 | Hu |
| 2016/0086970 | A1 | 3/2016 | Peng |
| 2016/0300724 | A1 | 10/2016 | Levy et al. |
| 2016/0314042 | A1 | 10/2016 | Plants |
| 2017/0092370 | A1 | 3/2017 | Harari |
| 2017/0092371 | A1 | 3/2017 | Harari |
| 2017/0148517 | A1 | 5/2017 | Harari |
| 2017/0148810 | A1 | 5/2017 | Kai et al. |
| 2017/0213821 | A1 | 7/2017 | Or-Bach et al. |
| 2017/0358594 | A1 | 12/2017 | Lu et al. |
| 2018/0095127 | A1 | 4/2018 | Pappu et al. |
| 2018/0108416 | A1 | 4/2018 | Harari |
| 2018/0269229 | A1 | 9/2018 | Or-Bach et al. |
| 2018/0331042 | A1 | 11/2018 | Manusharow et al. |
| 2018/0366471 | A1 | 12/2018 | Harari et al. |
| 2018/0366489 | A1 | 12/2018 | Harari et al. |
| 2019/0006009 | A1 | 1/2019 | Harari |
| 2019/0019564 | A1 | 1/2019 | Li et al. |
| 2019/0171391 | A1 * | 6/2019 | Dubeyko ............... G06F 3/0659 |
| 2019/0180821 | A1 | 6/2019 | Harari |
| 2019/0206890 | A1 | 7/2019 | Harari et al. |
| 2019/0214077 | A1 | 7/2019 | Oh et al. |
| 2019/0238134 | A1 | 8/2019 | Lee et al. |
| 2019/0244971 | A1 | 8/2019 | Harari |
| 2019/0303042 | A1 | 10/2019 | Kim et al. |
| 2019/0325945 | A1 | 10/2019 | Linus |
| 2019/0325964 | A1 | 10/2019 | Harari |
| 2019/0319044 | A1 | 11/2019 | Harari |
| 2019/0355747 | A1 | 11/2019 | Herner et al. |
| 2019/0370117 | A1 | 12/2019 | Fruchtman et al. |
| 2020/0051990 | A1 | 2/2020 | Harari et al. |
| 2020/0098779 | A1 | 3/2020 | Cernea et al. |
| 2020/0176468 | A1 | 6/2020 | Herner et al. |
| 2020/0243486 | A1 | 7/2020 | Quader et al. |
| 2021/0247910 | A1 | 8/2021 | Kim et al. |
| 2021/0248094 | A1 | 8/2021 | Norman et al. |
| 2021/0265308 | A1 | 8/2021 | Norman et al. |

FOREIGN PATENT DOCUMENTS

| | | |
|---|---|---|
| KR | 20120085591 A1 | 8/2012 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", dated Mar. 20, 2020, 2 pages.
"Notification of Reasons for Refusal, Japanese Patent Application 2018-527740", (English translation), dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.

(56) References Cited

OTHER PUBLICATIONS

"PCT Search Report and Written Opinion, PCT/US2019/014319", dated Apr. 15, 2019.
"PCT Search Report and Written Opinion, PCT/US2019/052446", dated Dec. 11, 2019.
"PCT Search Report and Written Opinion, PCT/US2020/015710", dated Jun. 9, 2020.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 Gb 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2020/065374", dated Mar. 15, 2021, 17 pages.
"PCT Search Report and Written Opinion, PCT/US2021/016964", dated Jun. 15, 2021, 19 pages.

\* cited by examiner

HIGH CAPACITY MEMORY MODULE INCLUDING WAFER-SECTION MEMORY CIRCUIT

CROSS REFERENCE TO RELATED APPLICATIONS

This application claims priority to U.S. Provisional Patent Application No. 62/980,592, entitled "Stacked Wafer Scale Memory," filed on Feb. 24, 2020, which is incorporated herein by reference for all purposes.

The present application is related to: (i) U.S. provisional patent application ("Provisional Application I"), Ser. No. 62/971,859, entitled "Quasi-volatile Memory System," filed on Feb. 7, 2020; (ii) U.S. provisional patent application ("Provisional Application II"), Ser. No. 62/980,596, entitled "Quasi-volatile Memory System-Level Memory," filed on Feb. 24, 2020; (iii) U.S. provisional patent application ("Provisional Application III"), Ser. No. 63/027,850, entitled "Quasi-volatile Memory System-Level Memory," filed on May 20, 2020, now U.S. non-provisional application Ser. No. 17/169,212, filed Feb. 5, 2021; (iv) U.S. provisional patent application ("Provisional Application IV), Ser. No. 62/971,720, entitled "High-Capacity Memory Circuit with Low Effective Latency," filed on Feb. 7, 2020, now U.S. non-provisional application Ser. No. 17/169,387, filed Feb. 5, 2021; and (v) U.S. provisional patent application ("Provisional Application V), Ser. No. 62/980,571, entitled "Channel Controller For Shared Memory Access," filed on Feb. 24, 2020, now U.S. non-provisional application Ser. No. 17/183,154, filed Feb. 23, 2021. Applications I-V (collectively, the "Provisional Applications") are hereby incorporated by reference in their entireties.

FIELD OF THE INVENTION

The present invention relates to semiconductor memories and their usage and technology. More specifically, the present invention relates to semiconductor memory modules forming using wafer-section memory circuits.

BACKGROUND OF THE INVENTION

Conventional memory systems of different technology and architecture types are known. For example, a memory system may be built with components that are selected based on the requirements and the memory access patterns of a host computer, a telecommunication device, or another hardware and software (hereinafter, such a memory-accessing device is referred to as the "host," "host processor," or "host system"). In a conventional host system, a memory system may include different memory types, such as random-access memory (RAM), flash memory, read-only memory (ROM), and other suitable types of memory devices.

In the prior art, a RAM is typically a volatile memory device that stores the host's most frequently accessed data. A volatile memory loses its data when power is interrupted. Examples of RAMs include static RAM ("SRAM") and dynamic RAM ("DRAM"). A typical SRAM circuit is a single-bit flip-flop formed by cross-coupled transistors. A typical DRAM circuit includes an access transistor and a storage capacitor. To compensate for charge leakage from the capacitor, the DRAM circuit requires frequent refreshes to retain the stored data. Because a typical DRAM circuit has fewer components than a typical SRAM circuit, the DRAM circuit can achieve a higher data density than SRAM circuit; however, the typical SRAM circuit is faster and does not require refreshing.

Because of their cost and density advantages, DRAMs have been the dominate technology to service host systems, many of which are often referred to as "central processing units" ("CPUs"). As used herein, the term "CPU" refers to any logic circuit that manages and accesses a memory system, and thus includes such device as a graphics processing unit ("GPU"). Recently, DRAMs are seen to be reaching their limits, as it has become increasingly difficult for circuit density improvement (e.g., by reducing the physical dimensions of the storage capacitor). As the DRAM capacitor decreases in size, higher refresh rates are required, which increase power consumption. One impediment to changing refresh rates is the industry standards (e.g., the DDR standards promulgated by JEDEC) that compliant host systems must follow. Also, a higher refresh rate decreases the fraction of time available for memory access by the host, thereby adversely impacting performance. One approach for maintaining the conventional refresh rate is to refresh more units of memory in each refresh cycle, at the expense of power and heat dissipation. These conditions limit the current growth rate of DRAM density.

Thus, a long-felt need exists for a different memory type without the conventional power and density limitations. A novel type of memory-referred to as "quasi-volatile memory" ("QV memory") -is believed to have an effective performance rivalling DRAMs while having a much higher density. The QV memory is disclosed, for example, in U.S. Pat. No. 10,121,553 ("the '553 Patent"), entitled "Capacitive-coupled Non-volatile Thin-film Transistor NOR Strings in Three-Dimensional Arrays," issued on Nov. 16, 2018. The '553 patent is incorporated herein by reference in its entirety. Like those of a non-volatile memory (NVM), the memory cells of a QV memory each store a data bit as an electric charge in a charge storage material (e.g., ONO). In one instance, a high-capacity QV memory is implemented by 3-dimensional arrays of NOR-type memory strings formed over a semiconductor substrate. Because of the nature of its charge-storage layer, a typical QV memory cell has a much longer data retention time than a DRAM cell and, hence, requires a lower refresh rate than the DRAM cell. For example, a typical DRAM system is designed to be refreshed every 64 milliseconds; a QV memory with a comparable effective access performance, however, may be refreshed every 10 minutes. The reduced refresh rate provides the QV memory great advantages in a lower power requirement, a reduced heat dissipation, and a higher memory availability. The memory availability delivers a better host performance. In the present description, a 3-dimensional QV memory including 3-dimensional arrays of NOR-type memory strings formed over a semiconductor substrate is also referred to as a 3D QVMTM.

While a write operation in both an NVM and an QV memory requires a preceding erase step, the QV memory completes the task in a much shorter time (e.g., in the order of a microsecond). Also, because the NVM typically carries out the erase operation simultaneously over a large block of memory cells, the erase operation typically requires management by a complex controller. Furthermore, because of its low wear-out, resulting from its generally lower-voltage operations, a typical QV memory cell has much higher endurance (e.g., $10^{11}$ erase-program cycles) than a typical NVM cell (e.g., $10^4$ erase-program cycles).

In host systems using memory technology, the memory density and operating speed are very important. To improve these parameters, memory designers are considering high density solutions through die stacking, such as vertical stacking of DRAM dies. Die-stacked memory devices are emerging as an essential way to achieve high densities in memory capacities. While die-stacked memory works for some applications and usage, it falls short of market needs and host system requirements.

SUMMARY OF THE INVENTION

In some embodiments, a memory device includes a first semiconductor wafer portion including two or more adjacent quasi-volatile memory circuits formed on a common semiconductor substrate where each quasi-volatile memory circuit being isolated from an adjacent quasi-volatile memory circuit by scribe lines; and a second semiconductor wafer portion including at least one memory controller circuit formed on a semiconductor substrate. The memory controller circuit includes logic circuits and interface circuits. The memory controller circuit is interconnected to the two or more adjacent quasi-volatile memory circuits of the first semiconductor wafer portion through interconnect structures and the memory controller circuit operates the two or more quasi-volatile memory circuits as one or more quasi-volatile memories.

These and other advantages, aspects and novel features of the present disclosure, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

FIGS. 6(a) and 6(b), illustrates wafer-section controller circuits which can be used to form the semiconductor memory device in embodiments of the present disclosure.

DETAILED DESCRIPTION

In embodiments of the present disclosure, a semiconductor memory device includes at least one wafer-section memory circuit bonded to a memory controller. The wafer-section memory circuit includes a semiconductor wafer portion including two or more memory semiconductor chips formed on a common semiconductor substrate and arranged to operate as a memory array. Each memory semiconductor chip is designed to operate as a stand-alone memory circuit and is separated from the other memory semiconductor chip by scribe lines. In some embodiments, the wafer-section memory circuit is flip-chip bonded to the memory controller semiconductor chip. In this manner, a memory module providing large memory capacity can be implemented in a compact size while minimizing the length of the signal line connections.

In embodiments of the present disclosure, the semiconductor memory device is applicable, for example, in a system that integrates a QV memory die with a logic die (e.g., using hybrid bonding), which enables new capabilities brought about by incorporating system-level features in the system architecture. Some of these capabilities are disclosed, for example, in co-pending patent application ("the Khandker Application"), Ser. No. 16/776,279, entitled "Device with Embedded High-Bandwidth, High-Capacity Memory using Wafer Bonding," filed on Jan. 29, 2020. In particular, the QV memory may be used in memory-centric computing applications that are unavailable in current DRAM-based system architectures. The Khandker Application is hereby incorporated by reference in its entirety.

Figure 1:
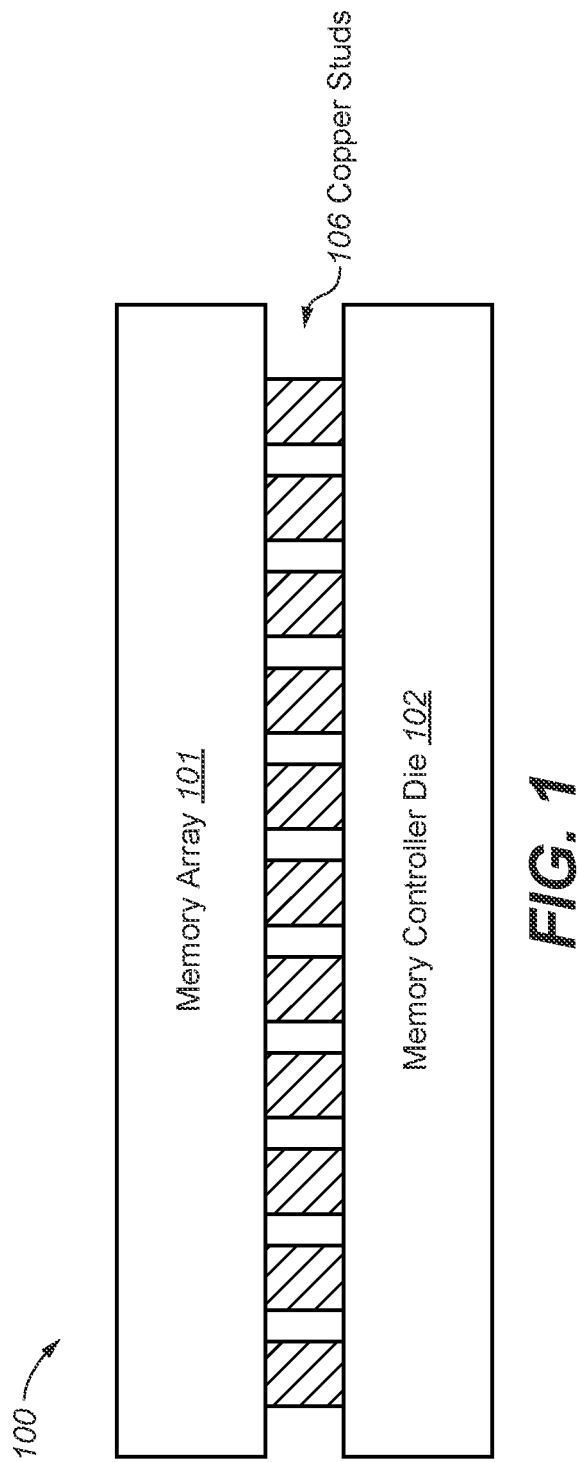
FIG. 1 illustrates a multi-die QV memory module in examples of the present disclosure.

FIG. 1 illustrates a multi-die QV memory module in examples of the present disclosure. As disclosed in the Khandker Application, a QV memory circuit may be built in a multi-die manner with at least one semiconductor die with a memory array ("memory die") and one semiconductor die with a memory controller ("controller die"), such as illustrated in FIG. 1. As shown in FIG. 1, a multi-die QV memory module 100 includes a memory die 101 and controller die 102 interconnected by copper interconnect conductors ("hybrid bonds" or "studs") 106. In the present illustrations, copper studs are used in a flip chip bonding method to connect the memory die to the controller die. The large number of hybrid bonds provide a high-bandwidth data interface. In some embodiments, the memory die 101 is constructed as a QV memory described in the '553 patent. For instance, the QV memory may be constructed as 3-dimensional arrays of NOR-type memory strings formed over a semiconductor substrate and is also referred to as a 3D QVMTM.

In some embodiments, the memory die 101 includes memory arrays of thin-film storage transistors where the memory arrays are organized as a 2-dimensional array of "tiles" (i.e., the tiles are arranged in rows and columns) formed above a planar semiconductor substrate. Each tile can be configured to be individually and independently addressed or larger memory segments (e.g., a row of tiles or a 2-dimensional block of tiles) may be created and configured to be addressed together. In some examples, each row of tiles (a "tile row") may be configured to form an operating unit, which is referred to as a "bank." A group of banks, in turn, form a "bank group." In that configuration, the banks within a bank group may share data input and output buses in a multiplexed manner. As thus configured, the tile is a building block that allows flexibility in configuring the system to adapt to application requirements. Support circuitry for the memory array may be formed in the planar semiconductor substrate. In one embodiment, the support circuitry for the thin-film storage transistors of each tile is provided for modularity in the portion of the semiconductor substrate underneath each tile. Examples of support circuitry include error-correction encoders and decoders, address decoders, power supplies, check-bit generators, sense amplifiers, and other circuits used in memory operations.

On controller die 102, a memory controller for accessing the memory arrays of memory die 101 is formed. The tile-based design of the memory die 101 naturally results in a modular organization of hybrid bonds to controller die 102, which leads to modularization of controller circuitry also. For example, the controller may adopt a design that is based on banks and bank groups to allow for simultaneous access to a large amount of data. Many variations of such a control scheme may be achieved by configuring data routing and control in the controller logic circuitry. Memory controller die 102 may also include one or more external interfaces, such as memory interfaces for host access and other system functions, in addition to conventional memory controller functions. Alternatively, the memory control functions may be divided between memory die 101 and controller die 102 (e.g., some controller circuitry may be implemented on memory die 101). In that regard, the Khandker Application discloses building a memory die using a process optimized for memory circuits and building a controller die using an advanced manufacturing process that is optimized for forming low-voltage and faster logic circuits. The controller die provides significant improvement over conventional circuitry that supports access to the memory arrays.

In one embodiment, the memory arrays on the memory die 101 is each an 8-layer (i.e., 8-plane) memory array which provides 8 pages of data with each activated row. If the number of layers is increased to 16, 16 pages of data are provided with each activated row without materially affecting the tile's footprint. With 4 planes and a 1024-bit page, each row in a tile has 4,096 bits. Of course, the number of rows in a tile may be adjusted for a greater or a lesser capacity to trade-off for a longer or a shorter access time, in accordance with the intended applications.

As described in the Khandker Application, multiple memory dies may be stacked atop one upon another and interconnected for data routing among the memory dies by, for example, through-silicon vias ("TSVs"). The stacked memory dies require maintaining an internal regular topological and control structure. For example, the memory arrays in each memory die in the stack may be controlled according to an assign-and-select methodology discussed below. Such an organization readily lends to a design that allows each memory die in the stack to have full access to the high bandwidth hybrid bond interface to the controller die. In addition, a customizable design allows many variations to adapt to various application needs; such variations may be realized by suitably configuring the controller logic circuitry in the controller die. The resulting memory system has a high memory capacity accessible by a high bandwidth memory interface.

The QV memory module—which integrates at least one memory die and one controller die—results in faster memory controller operations and, thus, faster memory performance. In addition, as the memory die or dies and the controller die or dies may be separately fabricated under their respective specialized manufacturing processes, the QV memory module enables the high-capacity memory arrays of the memory dies to be accessible at a high bandwidth from high-density logic circuits in the controller die, leading to new capabilities not previously achievable in conventional memory circuits. By integrating memory and controller dies that are each configured and optimized for specific memory operations, the QV memory module may achieve reduced die size in each memory or controller die.

The dies may be integrated using one or more integration techniques, including, for example, hybrid bonds, TSVs, exposed contacts and other suitable interconnect techniques for a very high interconnection density. The resulting advantage is especially significant when multiple memory dies are stacked to provide a high memory capacity, while sharing a memory controller among the multiple memory dies achieves a reduced cost-per-unit.

Figure 2:
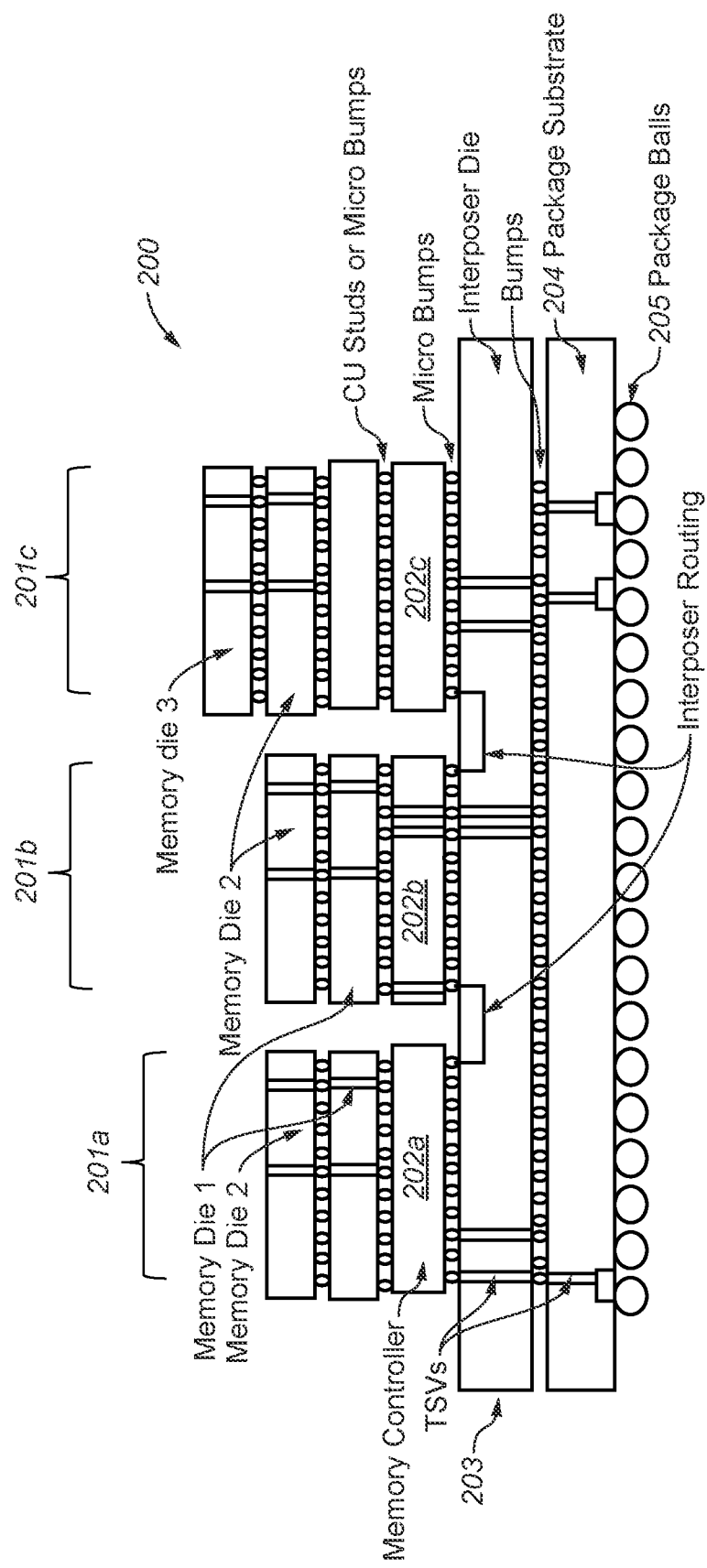
FIG. 2 shows a QV memory module including in one package multiple QV memory modules and interposer die in examples of the present disclosure.

FIG. 2 shows a QV memory module including in one package multiple QV memory modules and interposer die in examples of the present disclosure. Referring to FIG. 2, a QV memory module 200 integrates in one package multiple QV memory modules 201a, 201b and 201c, and interposer die 203. QV memory modules 201a and 201b each include two stacked memory dies, and QV memory module 201c includes three stacked memory dies; a memory die in QV memory modules 201a-201c, for example, may receive on one side of the memory die signals over micro-bumps or hybrid bonds from another stacked memory die. These received signals may be routed by conductors formed on that surface of the memory die to TSVs, which route those signals to conductors on the opposite surface of the memory die. QV memory modules 201a-201c are controlled from their respective controller dies 202a-202c. In each QV memory module 201a, 201b or 201c, the entire stack of memory arrays all essentially respond to the same signaling and differentiated by logic circuits that determines which stacked memory die is being accessed and needs to be active. The non-selected memory die or dies do not become active when not selected.

Routing of signals among QV memory modules 201a-201c is accomplished through conductors formed on interposer substrate 203 (e.g., a silicon die). QV memory module 200 may be encapsulated in a conventional package. In FIG. 2, data and control signals for QV memory module 200 to and from external circuitry may be routed, for example, through solder balls connections 205 attached to package substrate 204 (e.g., a printed circuit board (PCB)) and by solder bumps with each of QV memory modules 201a-201c. The memory dies in each of QV memory module 201a-201c may be stacked atop a single memory controller, each memory die providing substantially the same set of signals to the memory controller. The signals from each memory die may be routed to the controller die through TSVs in intervening memory dies, if necessary. In this manner, the memory dies formed an integrated memory system, with signals received into each memory die gated by a select line. Power savings may be achieved by deactivating any memory die.

In addition to stacking memory dies, a QV memory module may also include dies with other functionalities, with their signals routed in like manner. Consequently, the memory arrays in a QV memory module may be used to support the added functions in these non-memory dies. Thus, small semiconductor devices (e.g., semiconductor circuits for mobile phones and other portable devices) may be incorporated in a QV memory module as a very dense package. Furthermore, this approach allows the functional circuitry in these small devices to directly connect to the memory dies through high-bandwidth connections (e.g., hybrid bonds), thereby attaining both high performance and low power dissipation without bottlenecks (e.g., conventional memory buses and off-chip input and output drivers). If a controller die is fabricated using an advanced manufacturing process, the memory controller may only require a small silicon area, relative to the footprint of its associated high-capacity memory die. Preferably, the memory dies and the controller have substantially the same silicon areas, so that signaling can be achieved over short conductors, which avoids interconnection delays. The controller die, therefore, has silicon area that can be occupied by other logic circuits, if desired. For example, the memory controller die may incorporate high speed SRAM to be used in speeding up the functionality of the QV memory circuit to realize a memory system including QV memory arrays for high capacity and SRAM for high speed operations.

The memory interface provides an external device (e.g., a host processor) access to a QV memory module. In a conventional memory system, access is provided by a typically industry-standard memory interface (e.g. double data rate (DDR) or a high-bandwidth memory (HBM) interface). The conventional memory interface is controlled by the memory controller, regardless of memory capacity, as the memory controller manages all appropriate signals required by the memory system's internal organization. The memory interface of a QV memory module may also be implemented using this conventional approach. In some embodiments, the memory interface of a QV memory module may be implemented using any industry-standard interface (e.g., DDR, SRAM, Gen-Z, PCIe, CXL and CCIX), according to the requirements of the intended application (e.g., high-speed, low-power, high-capacity, or any suitable combination). For example, CXL, CCIX and Gen-z interfaces may be used to allow greater host processor control. For use as a media server, a web-hosting server or any of various graphics applications (e.g., any application that supplies a high data throughput to a network), the QV memory module may have a PCIe (e.g., PCIe controller) host interface.

In some embodiments, the QV memory module can be packaged with a memory interface that conforms to an industry-standard dual-in-line memory module (DIMM). In one embodiment, an external interface is connected to the memory arrays of each memory die substantially identically. In that configuration, buffers for the input and output data of each memory die may be provided in the controller die, such as in the logic circuitry of an external interface. Such an approach maintains compatibility with existing system designs and provides routing efficiency within the QV memory module, as signals routing and protocols between the memory controller and each memory die may be made modular and substantially identical from memory die to memory die. Alternatively, when the memory controller connects to each memory die independently, timing variations from memory die to memory die due to different routing paths with different signal delays are possible, resulting in degraded window sampling, higher error rates, additional line drivers, board space and power dissipation.

Figure 3:
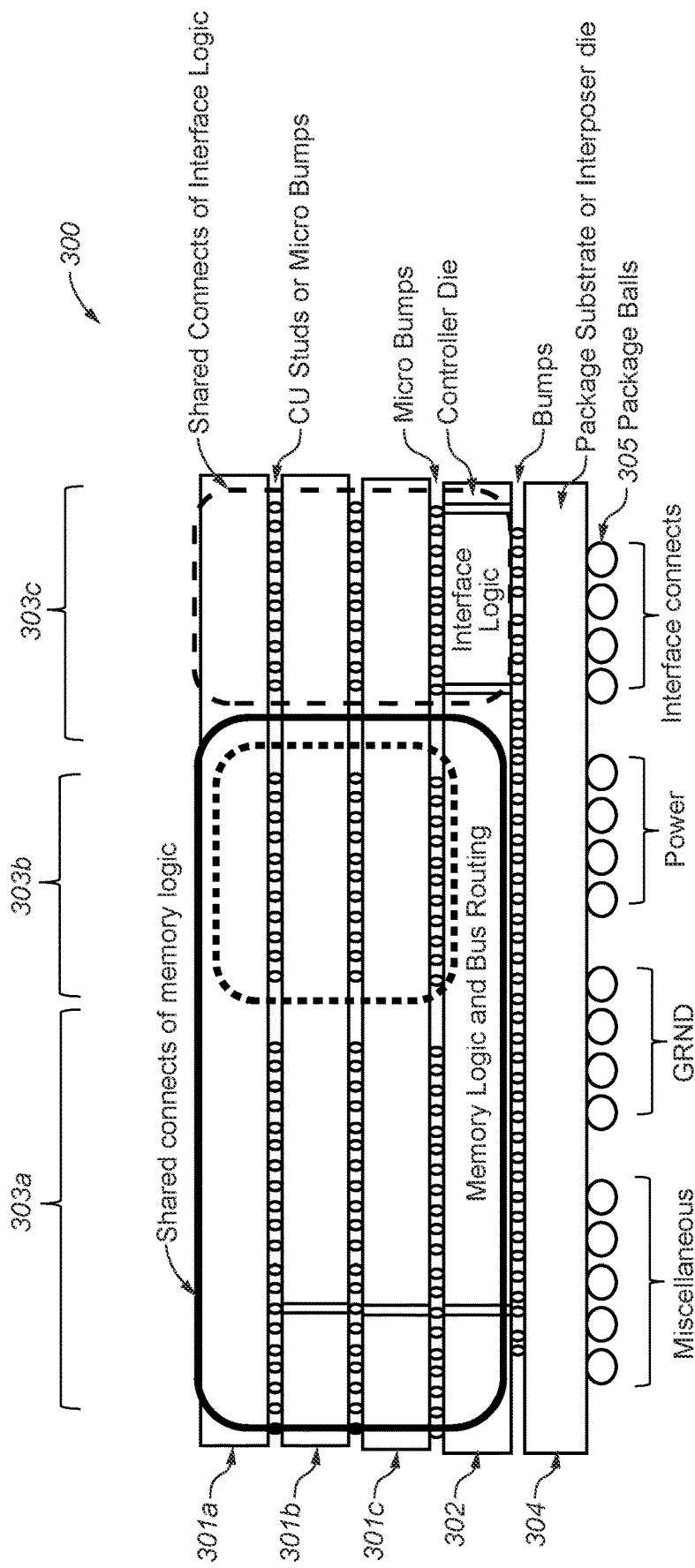
FIG. 3 shows a QV memory module organized into memory channels or signal groups in examples of the present disclosure.

FIG. 3 shows a QV memory module organized into memory channels or signal groups in examples of the present disclosure. Referring to FIG. 3, a QV memory module 300 includes memory dies 301a-301c and a controller die 302, organized into memory channels or signal groups 303a-303c in the present example. Each signal group is supported by its circuitry in memory dies 301a-301c, controlled by corresponding circuitry in controller die 302. For example, for each of signal groups 303a and 303b, the circuitry for the signal group on each memory die shares the corresponding circuitry in controller die 302. A combination of hybrid bonds and TSVs route signals exchanged between controller 302 and each memory die. Under this arrangement, for example, each signal group may provide its refresh signals independently to service its memory arrays, without requiring synchronization between signal groups. In each signal group, the signals to and from each memory die are routed directly to an external interface formed on controller die 302. Signals over the external interface are routed through s package substrate (e.g., a PCB) where the signals are provided to external connections over solder balls 305. (Alternatively, an interposer substrate (not shown) may be provided for connection to additional QV memory modules or other integrated circuits.) As shown in FIG. 3, the external connections typically encompass power and ground pins, interface control and data signals, and any other suitable signals.

In one embodiment, a high-capacity memory system may have two or more external interfaces, each independently servicing at least one memory channel or internal signal group. In a high-capacity memory system, the memory circuit may be partitioned into two separate memory channels, so that a QV memory module implemented by one stack of memory dies may be seen logically, for example, as a QV memory module with two stacks of memory dies. This dual-access capability facilitates more efficient access to the two memory channels through independently controlled ports. For a QV memory module with 128-Gb or 256-Gb memory dies—which is likely to be contemporary with 32 Gb DRAMs—having dual interfaces is advantageous. (A Gb is $2^{30}$ bits of data; a GB is $2^{33}$ bits of data.) Even larger number of channels may be suitable for memory dies with even greater capacity.

Figure 4:
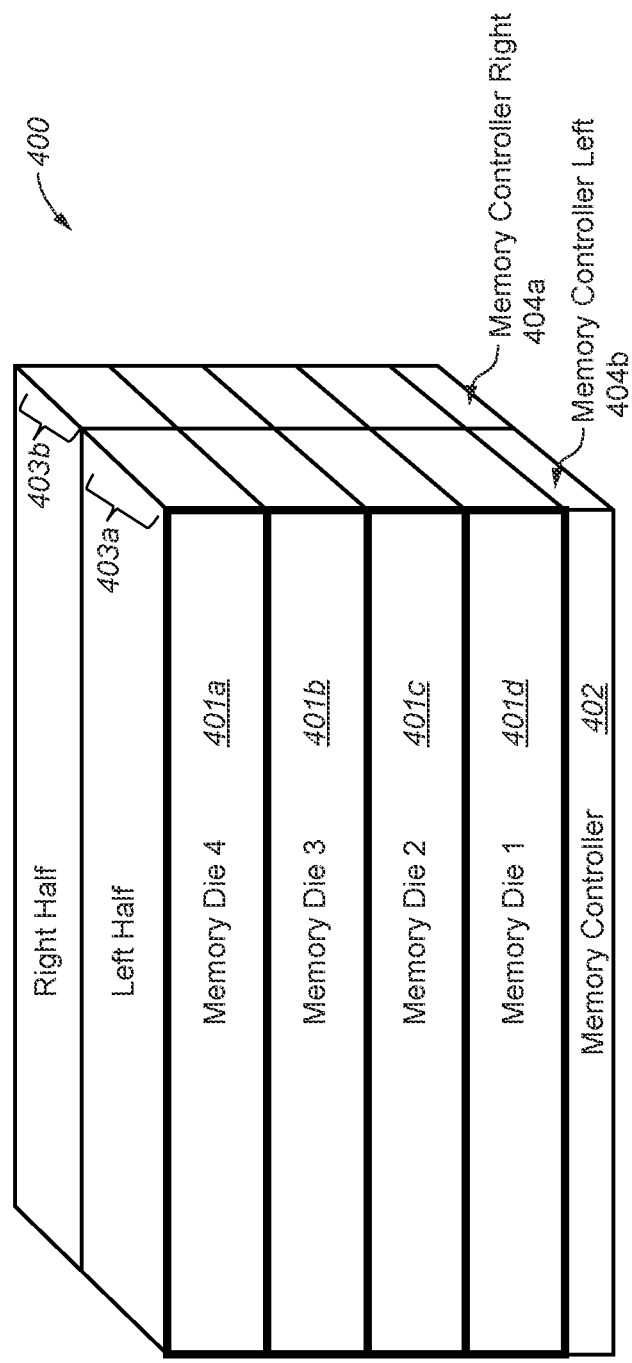
FIG. 4 shows a QV module partitioned into memory channels in examples of the present disclosure.

FIG. 4 shows a QV module partitioned into memory channels in examples of the present disclosure. Referring to FIG. 4, a QV module 400, including memory dies 401a-401d and controller die 402, is partitioned into memory channels 403a and 403b in the present example. In FIG. 4, the circuitries in memory dies 401a-401d for memory channels 403a and 403b are controlled, respectively, by memory controllers 404a and 404b. Because of the high capacity of QV memory arrays, the partitioning of a single stacked of dies into even greater number of memory channels, providing more than two memory interfaces are suitable in many anticipated applications. For example, a single QV memory module may support a multi-processor system, in which each processor is allocated a separate memory channel in the QV memory module for their respective independent operations. The multi-channel approach ensures a small enough granularity at the memory level for greater system level performance. In particular, the separate memory channels provide for separate simultaneous access, thereby improving host performance by enabling parallel operation.

There are applications where high bandwidth memory is desired. For example, there are emerging applications such as AI (artificial intelligence) that requires a large amount of memory at very fast operation. In another application, it is desirable to combine the memory with the graphics processing unit (GPU) array. Combining memory and GPU on the same die is not practical from both process perspective and the required die area. In conventional configurations, a DRAM array is connected to the GPU using a high-speed channel. However, such a configuration limits the processor core operation as the memory usually cannot feed the array of processor cores fast enough for the GPU or AI processors to function.

In embodiments of the present disclosure, a QV memory module is implemented as a semiconductor memory device including at least one wafer-section memory circuit bonded to a wafer-section controller circuit. The wafer-section memory circuit includes a semiconductor wafer portion including two or more memory semiconductor dies formed on a common semiconductor substrate and separated by scribe lines. Each memory semiconductor die has a memory array formed thereon and is designed to operate as a standalone memory circuit. The wafer-section controller circuit includes a semiconductor wafer portion having the substantially the same planar size as the wafer-section memory circuit and including one or more memory controller dies formed on a common semiconductor substrate. When two or more memory controller dies are used, the controller dies are separated by scribe lines. Each controller semiconductor die has memory controller circuitry formed thereon and configured to access and operate the memory arrays on the memory dies, such as reading and writing data from and to the memory arrays. In embodiments of the present disclosure, the wafer-section memory circuit and the wafer-section controller circuit are bonded together, such as through flip-chip bonding method, to form a QV memory module where the two or more memory semiconductor dies can be operated as a monolithic memory circuit. The QV memory module can therefore realize very large memory capacity and improved memory performance.

Figure 5:
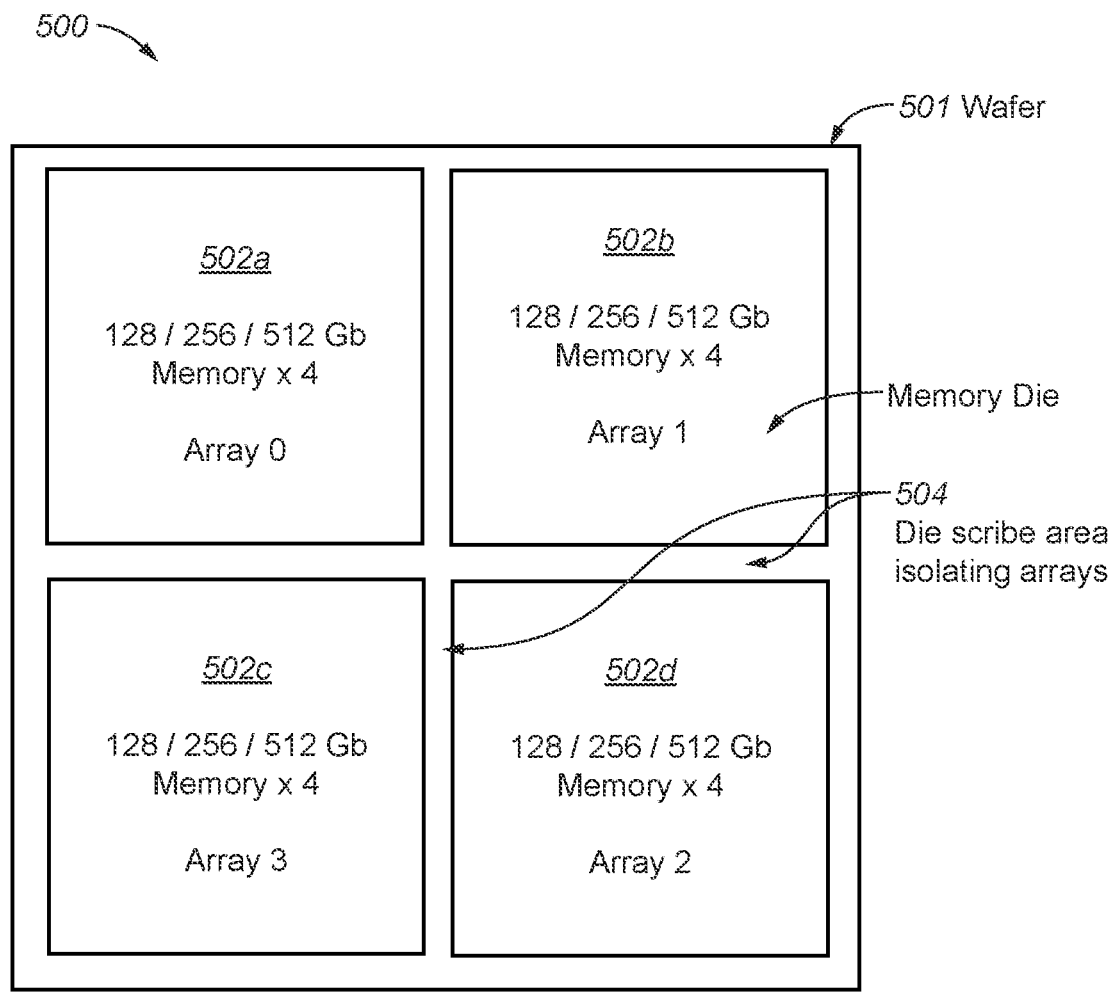
FIG. 5 illustrates a wafer-section memory circuit which can be used to form the semiconductor memory device in embodiments of the present disclosure.

In embodiments of the present disclosure, a wafer-section memory circuit refers to memory circuits fabricated as memory semiconductor dies on a common semiconductor substrate where two or more adjacent or adjoining memory semiconductor dies are grouped to form a memory array, without the individual semiconductor dies being singulated, or separated from each other. In conventional semiconductor fabrication processes, a semiconductor wafer is patterned and processed to form a two-dimensional array of semiconductor dies. A semiconductor wafer may have formed thereon hundreds or thousands of dies. The semiconductor dies formed on a wafer are separated by scribe lines. Scribe lines delineate the boundary of each adjoining semiconductor die and does not contain active circuits. After fabrication, individual semiconductor dies are singulated or diced along the scribe line. In embodiments of the present disclosure, a wafer-section memory circuit is formed by dicing a semiconductor wafer around a group of adjoining memory semiconductor dies. As a result, a wafer-section memory circuit includes multiple adjoining semiconductor dies formed on a common substrate and separated from each other by the scribe lines. The wafer-section memory circuit is separated or singulated from adjacent wafer-section memory circuit at the scribe lines between each wafer-section memory circuit FIG. 5 illustrates a wafer-section memory circuit which can be used to form the semiconductor memory device in embodiments of the present disclosure. Referring to FIG. 5, a memory circuit including a memory array is formed in each memory semiconductor die on a semiconductor wafer. A semiconductor wafer portion 501 includes four adjacent or adjoining memory semiconductor dies 502a-502d formed on the semiconductor wafer 501. In particular, the four adjoining memory semiconductor dies 502a-502d are grouped to form a wafer-section memory circuit 500. The memory semiconductor dies 502a-502d are separated and isolated from each other by scribe lines 504. Each memory semiconductor die 502a-502d includes a memory array formed thereon. In some embodiments, each memory semiconductor die 502a-502d is implemented as a quasi-volatile (QV) memory circuit, as described above.

In the present embodiment, the wafer-section memory circuit includes four memory semiconductor dies grouped in a two by two section on the wafer 501. The grouping of the memory semiconductor dies in FIG. 5 is illustrative only and not intended to be limiting. In embodiments of the present disclosure, two or more memory semiconductor dies in any configuration can be selected to form the group. For example, a wafer-section memory circuit may include any number of semiconductor dies. The selection may be made based on the capacity needs for the memory module to be formed. In another example, wafer-section memory circuit may include a given number of semiconductor dies to yield a given die size. For instance, the wafer-section memory circuit may be configured so that it has the same die size as the corresponding wafer-section controller circuit, as will be described in more detail below.

Figure 6:
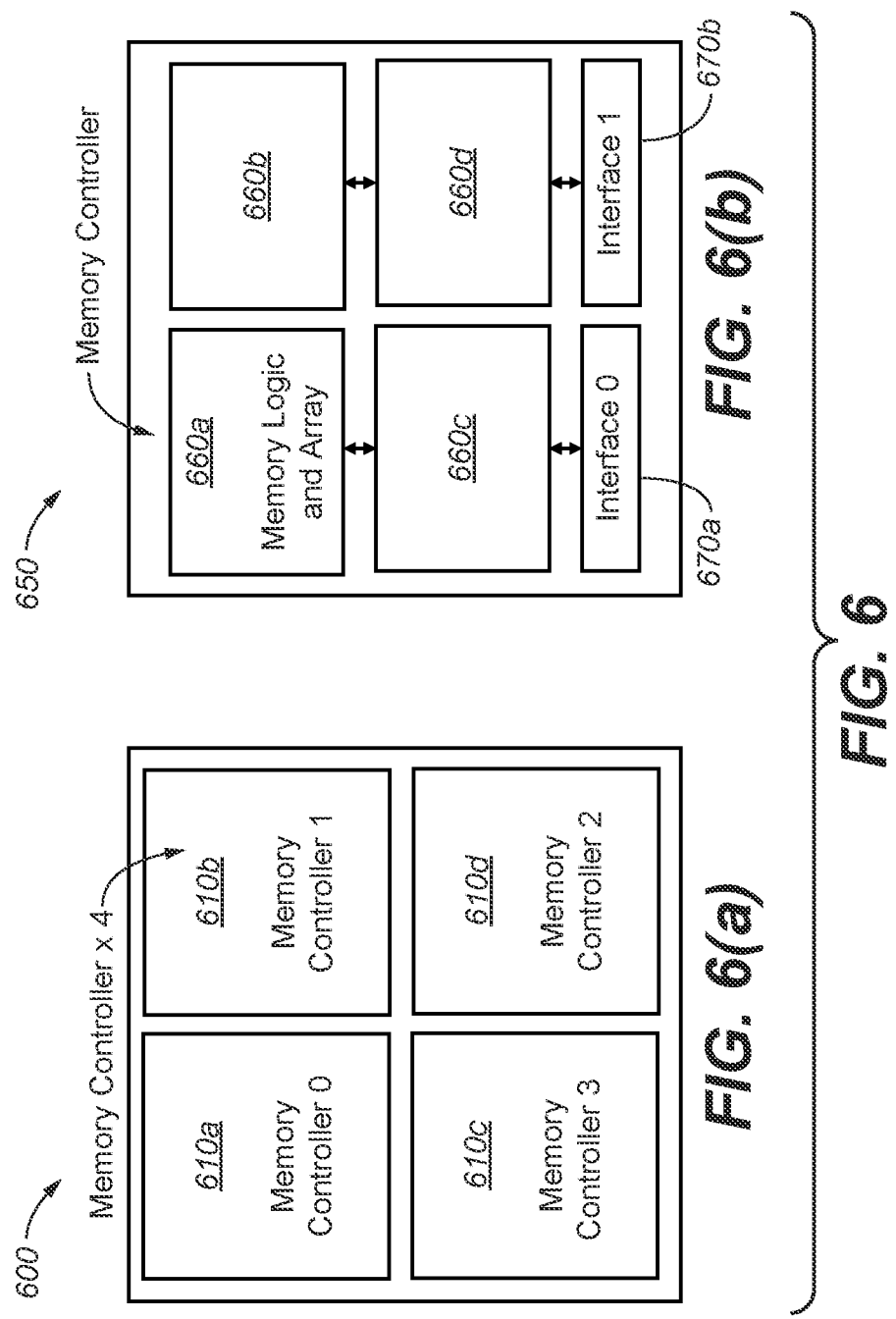
FIG. 6, which includes

FIG. 6, which includes FIGS. 6(a) and 6(b), illustrates wafer-section controller circuits which can be used to form the semiconductor memory device in embodiments of the present disclosure. Referring to FIG. 6, in embodiments of the present disclosure, a wafer-section controller circuit refers to memory controller logic circuits fabricated on a memory controller die. In some embodiments, the wafer-section controller circuit is formed as a wafer portion including a group of two or more memory controller dies that are separated by scribe lines. The wafer-section controller circuit is configured to have substantially the same area or equivalent size as the wafer-section memory circuit to be coupled thereto. Alternately, the wafer-section controller circuit is formed as a wafer portion including a single controller die where the single controller die has a die size that matches substantially the size of the wafer-section memory circuit to be coupled thereto, as will be explained in more details below. Having the memory circuit and the controller circuit to be the same planar size makes it easier to bond the two wafer portions and to provide interconnection between the memory and the controller circuits.

In one embodiment, the wafer-section controller circuit is formed using a group of adjacent or adjoining memory controller semiconductor dies grouped together to form a wafer-section memory controller, as shown in FIG. 6(a). In FIG. 6(a), a memory controller circuit is fabricated in each memory controller semiconductor die. A wafer-section memory controller circuit 600 includes a wafer portion of four memory controller semiconductor dies 610a to 610d grouped in a two by two section and arranged in the same manner as the memory semiconductor dies on the wafer-section memory circuit to which the controller circuit will be bonded. In this embodiment, each memory controller semiconductor die 610a-610d is separated from other controller semiconductor dies by scribe lines.

In alternate embodiments, the wafer-section controller circuit can be formed as one memory controller die having the same planar size as the corresponding wafer-section memory circuit, as shown in FIG. 6(b). In FIG. 6(b), a wafer-section memory controller circuit 650 includes memory logic circuit blocks 660a to 660d. Each memory logic block 660a-660d includes array interconnects for bonding to the corresponding memory circuits in the wafer-section memory circuit. The wafer-section memory controller circuit 650 further includes one or more interface circuits 670a and 670b for providing input/output data access by a host system.

Figure 7:
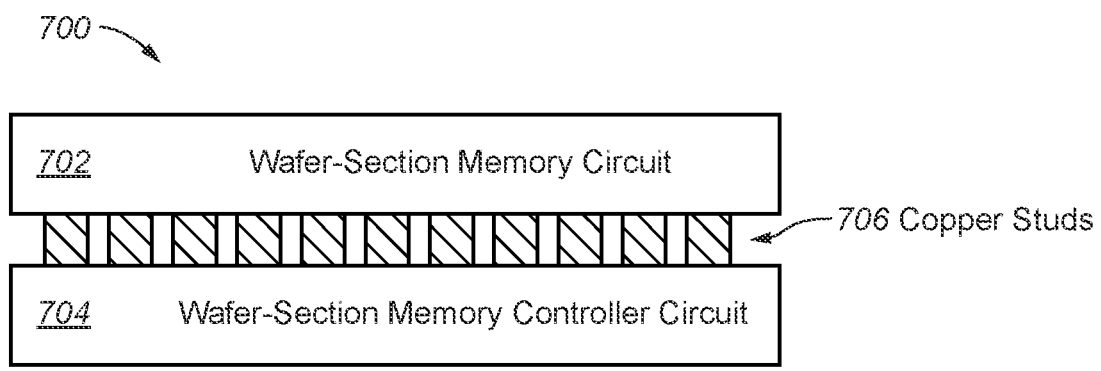
FIG. 7 illustrates a QV memory module constructed using the wafer-section memory circuit and the wafer-section controller circuit in embodiments of the present disclosure.

FIG. 7 illustrates a QV memory module constructed using the wafer-section memory circuit and the wafer-section controller circuit in embodiments of the present disclosure. Referring to FIG. 7, a wafer-section memory circuit 702 constructed as described above using a group of memory semiconductor dies is flip-chip bonded to a wafer-section memory controller circuit 704, such as by using hybrid bonds or copper studs 706, to form a QV memory module 700. In some embodiments, the wafer-section memory controller circuit 704 is configured as a single memory controller as shown in FIG. 6(b) to form the QV memory module 700 being a single memory device with one controller and a large memory capacity.

In other embodiments, the wafer-section memory controller circuit 704 is configured as a group of four memory controller semiconductor dies, as shown in FIG. 6(a). In that case, the QV memory module 700 operates as four memory devices with each memory array having its own controller circuit. Alternately, in some embodiments, the several memory controller semiconductor dies may be connected and gated to operate as a singular controller unit. As thus configured, the QV memory module 700 offers various configuration options to enable a variety of usage applications to users.

The QV memory module 700 of FIG. 7 provides many advantages over conventional memory circuit. The QV memory module 700 can be used as a main memory equivalent, replacing traditional DIMMs with a denser solution. Furthermore, the QV memory module can be located closer to the CPU core for better signaling characteristics and reduced power by having less RC loss in the connecting memory bus.

In other embodiments of the present disclosure, the QV memory module can be constructed to include additional layers of wafer-section memory circuits in the stack. For example, in some embodiments, a third semiconductor wafer portion may be stacked on the QV memory module using a wafer-section stacking technique. The third semiconductor wafer portion may be interconnected with the underlying wafer-section controller circuit using through-silicon vias. In some embodiments, the third semiconductor wafer portion is another wafer-section memory circuit. Accordingly, the memory capacity of the resulting QV memory module can be increased significantly by introducing another group of memory array.

In other examples, the QV memory module has further applications in proprietary system designs that have very demanding memory needs. For example, artificial intelligence (AI) systems or machine learning systems are prime candidates for using this type of dense memory solution. In some examples, an AI system developed with multiple number of cores and fabricated on an advanced fabrication process would result in a very large die. In embodiments of the present disclosure, an application-specific memory module is formed by connecting an application-specific logic circuit to the QV memory module formed as the semiconductor memory device described above.

Figure 8:
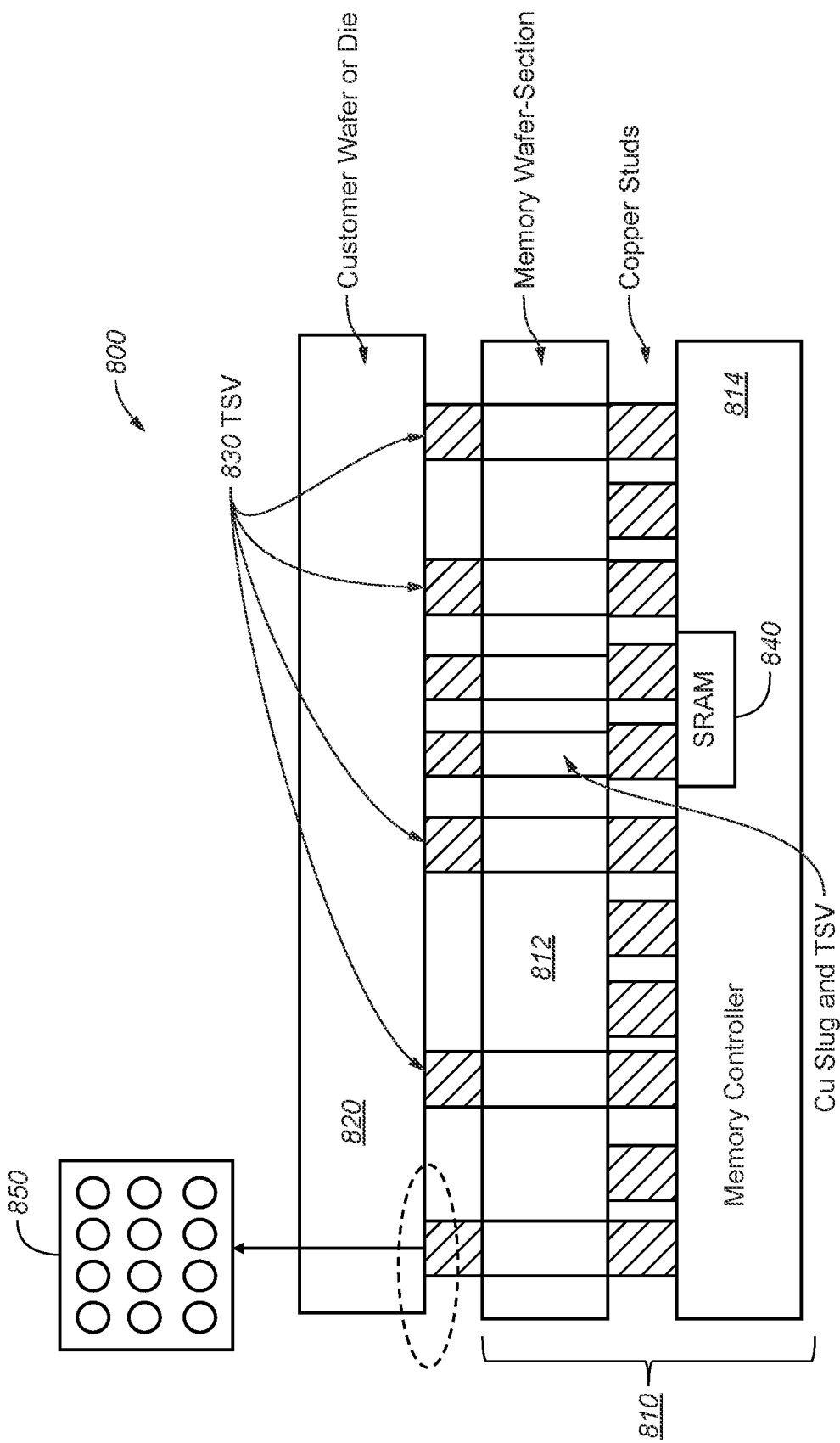
FIG. 8 illustrates a stacked application-specific memory module in embodiments of the present disclosure.

FIG. 8 illustrates a stacked application-specific memory module in embodiments of the present disclosure. Referring to FIG. 8, a stacked application-specific memory module 800 is formed by a QV memory module 810 coupled to an application-specific logic circuit 820. The QV memory module 810 may be constructed in the same manner described above and may include a wafer-section memory circuit 812 flip-chip bonded to a wafer-section controller circuit 814. To extend the functionality of the QV memory module, a third semiconductor component 820 is stacked on the QV memory module using a die stacking technique. In the present embodiment, the third semiconductor component 820 is bounded to the wafer-section memory circuit 812. Through silicon vias 830 formed in the wafer-section memory circuit 812 provide connections from the third semiconductor component 820 to the wafer-section controller circuit 814 under the wafer-section memory circuit 812.

As described above, in some embodiments, the third semiconductor component 820 is another wafer-section memory circuit. In this manner, the stacked application-specific memory module 800 is formed with stacked memory circuits to dramatically increase the memory capacity provided by the module.

In other embodiments, the third semiconductor component 820 is an application-specific logic circuit. For example, the application-specific logic circuit can be an AI processing core or a machine learning processing core. In that case, the stacked application-specific memory module 800 enables the application-specific logic circuitry to be provided with high density memory which is formed directly adjacent to the logic circuit. Such a module configuration enhances the data intensive processing of the application-specific logic circuitry. For example, the wafer-section memory circuit 812 may provide very high-density memory in the 128 Gb or 256 Gb range per memory die in the memory circuit. Importantly, the memory capacity is provided off the application-specific logic circuit and only requires the application-specific logic circuit to provide area for connecting to the memory circuit.

In the present embodiment, the wafer-section controller circuit 814 includes a SRAM circuit 840 formed thereon. The application-specific logic circuit 820 may access the SRAM circuit 840 in the controller circuit 814 through through-silicon vias formed in the intervening memory circuit wafer 812 and copper studs formed on the memory circuit 812 for connection to the controller circuit 814.

In embodiments of the present disclosure, the QV memory module not only offers high memory capacity, the QV memory module is also designed to read and write in pages of access. In some embodiment, the memory cells in the QV memory module is organized in a tile structure with each tile acting as a small memory circuit on its own. By configuring these tiles, it is possible to have data pages of a width needed to meet the throughput of very demanding applications. For example, a 2 KB page is possible so an AI processor design will not be limited by the normal memory bottleneck that typical DRAM suffers. The application-specific logic circuit also has access to the different blocks of memory as these signals are brought into the third semiconductor component for use. By having the block signaling available to a designer, the memory structure can be changed to fit the application needs, offering a user-defined memory structure, something not possible with a traditional memory bus structure.

In addition to the large page size and customized memory structure, the application-specific logic circuit 820 may also tap into the SRAM 840 formed on the memory controller circuit 814. The SRAM 840, like the memory circuit 812, can be routed to the application-specific logic circuit 820 to implement the application-specific designs. The routing, which can be realized by copper studs and TSV signaling, will provide very fast signaling.

In some embodiments, the application-specific logic circuit 820 is connected to the memory circuit 812 through TSVs and in addition may need to have its own input/output signaling. In embodiments of the present disclosure, generic arrays 850 of through-silicon vias can be formed on and spread across the wafer-section memory circuit 812 to provide I/O connections to the application-specific logic circuit 820. The TSV arrays 850 may be built to connect to unused copper studs of the memory circuit 812. The TSV arrays 850 can be used as I/O lines to connect the input/output signals of the application-specific logic circuit 820 to the controller circuit 814 where the input/output signals can be provided to systems outside of the module 800. In some embodiments, the TSV arrays 850 can also be employed as conduits for power distribution networks from the memory controller circuit 814 or the memory circuit 812 to the application-specific logic circuit 820 to distribute power throughout the application-specific logic circuit 820.

In embodiments of the present disclosure, the stacked application-specific memory module may include two or more wafer-section memory circuits stacked on each other to provide increased memory capacity. Furthermore, in other embodiments, the stacked application-specific memory module may further include an application-specific logic circuit bounded on the two or more wafer-section memory circuits. Accordingly, in embodiments of the present disclosure, the stacked application-specific memory module may be constructed to include a wafer-section controller circuit with one or more wafer-section memory circuits formed there on and at least one application-specific logic circuit formed on the stack. The large capacity of the memory circuits can be accessed as a regular memory device through the controller circuit. Furthermore, a portion of the memory capacity may be used by the application-specific logic circuit for more efficient processing operation, for example in applications such as artificial intelligence or machine learning.

As described above, the wafer-section memory circuit is formed by a group of memory semiconductor dies formed on a common semiconductor substrate and separated by scribe lines. By nature of being separated by the scribe lines, the memory semiconductor dies are not connected to each other. In embodiments of the present disclosure, structures and methods for interconnecting the memory dies that are separated by scribe lines are described.

Figure 9:
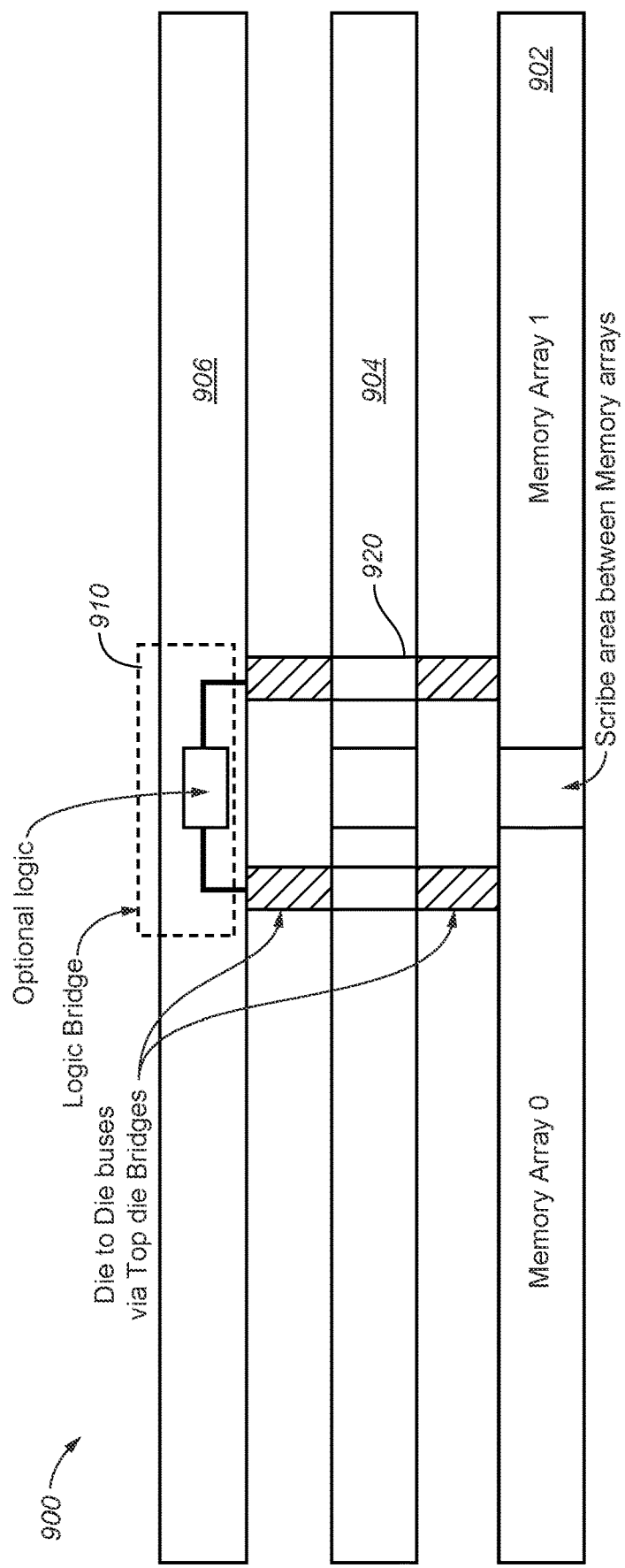
FIG. 9 illustrates one method of semiconductor die interconnection that can be implemented in the QV memory module in embodiments of the present disclosure.

FIG. 9 illustrates one method of semiconductor die interconnection that can be implemented in the QV memory module in embodiments of the present disclosure. Referring to FIG. 9, a QV memory module 900 includes two or more wafer-section memory circuits 902, 904 stacked on top of each other and a third semiconductor layer 906. The third semiconductor layer 906, being the topmost semiconductor layer, may be another wafer-section memory circuit or an application-specific logic circuit. In the present embodiment, one or more logic bridge circuits 910 are formed on the topmost semiconductor layer 906. Data buses 920, such as formed by copper studs, hybrid bonds and TSVs, provide a signal pathway for connecting signals across the scribe lines between the memory semiconductor dies. In this manner, one memory circuit (e.g. memory array 0) can communicate with an adjacent or nearby memory circuit (e.g. memory array 1). In some embodiments, signals that are shared or common among the memory semiconductor dies can be connected to the signal pathway to enable certain ordered connections to be made. In FIG. 9, other copper studs and TSV's are omitted and only the data buses 920 and the logic bridge circuit are shown.

In the present embodiment, the QV memory module 900 includes two stacked wafer-section memory circuits 902 and 904 while the third semiconductor layer 906 provides the logic bridges for connecting memory circuits across scribe lines. The embodiment shown in FIG. 9 is illustrative only and not intended to be limiting. In other embodiments, the QV memory module may include a single layer of wafer-section memory circuit and the logic bridges 910 are formed in a second semiconductor layer stacked on the wafer-section memory circuit.

In some embodiments, the topmost semiconductor layer 906 is implemented as a field programmable gate array (FPGA) which includes programmable connections as the logic bridge circuits. The FPGA provides routing options based on a program connect methodology that can be used to enable and disable signals to the bridge bus 920. By offering the configuration flexibility through the FPGA, the memory arrays can be made to operate in different ways based on the application needs.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A memory device comprising:

a first semiconductor wafer portion comprising two or more adjacent quasi-volatile memory circuits formed on a common semiconductor substrate, each quasi-volatile memory circuit being isolated from an adjacent quasi-volatile memory circuit by scribe lines;

a second semiconductor wafer portion comprising at least one memory controller circuit formed on a semiconductor substrate, the memory controller circuit comprising logic circuits and interface circuits, wherein the first semiconductor wafer portion is flip-chip bonded to the second semiconductor wafer portion and the memory controller circuit is interconnected to the two or more adjacent quasi-volatile memory circuits of the first semiconductor wafer portion through a first set of interconnect structures; and wherein the memory controller circuit operates the two or more quasi-volatile memory circuits as one or more quasi-volatile memories; and a third semiconductor component formed on a third semiconductor substrate, the third semiconductor component being stacked on the first semiconductor wafer portion on a side opposite the second semiconductor wafer portion and is connected to the memory controller circuit of the second semiconductor wafer portion through a second set of interconnect structures formed in the first semiconductor wafer portion, the second set of interconnect structures being formed in and through the semiconductor substrate of the first semiconductor wafer portion to provide connections from the third semiconductor component to the memory controller circuit formed on the second semiconductor wafer portion, the third semiconductor component comprising active circuitry, one or more logic bridge circuits and two or more adjacent quasi-volatile memory circuits formed on a common semiconductor substrate or an application-specific logic circuit, wherein a first quasi-volatile memory circuit in the first semiconductor wafer portion is interconnected with a second quasi-volatile memory circuit in the first semiconductor wafer portion through data buses connected to the logic bridge circuits.

2. The memory device of claim 1, wherein the second semiconductor wafer portion comprises two or more adjacent memory controller circuits formed on the semiconductor substrate, each memory controller circuit being isolated from an adjacent memory controller circuit by scribe lines.

3. The memory device of claim 2, wherein the first semiconductor wafer portion includes a first number of quasi-volatile memory circuits arranged in a first arrangement and the second semiconductor wafer portion includes the same number of memory controller circuits as the first number of quasi-volatile memory circuits arranged in the first arrangement, each memory controller circuit being configured to operate a corresponding quasi-volatile memory circuit.

4. The memory device of claim 3, wherein the second semiconductor wafer portion has the same planar size as the first semiconductor wafer portion.

5. The memory device of claim 3, wherein the first semiconductor wafer portion comprises four quasi-volatile memory circuits arranged in a two-by-two section and the second semiconductor wafer portion comprises four memory controller circuits arranged in the two-by-two section.

6. The memory device of claim 1, wherein the second semiconductor wafer portion comprises one memory controller circuit formed on the semiconductor substrate, the second semiconductor wafer portion being the same planar size as the first semiconductor wafer portion.

7. The memory device of claim 6, wherein the one memory controller circuit of the second semiconductor wafer portion comprises a plurality of memory logic circuit blocks, each logic circuit block being interconnected to a corresponding quasi-volatile memory circuit on the first semiconductor wafer portion.

8. The memory device of claim 1, wherein:
the third semiconductor component is a third semiconductor wafer portion comprising a third set of two or more adjacent quasi-volatile memory circuits formed on the third semiconductor substrate, each quasi-volatile memory circuit being isolated from an adjacent quasi-volatile memory circuit by a third set of scribe lines,
wherein the quasi-volatile memory circuits of the third semiconductor wafer portion are connected to the memory controller circuit through the second set of interconnect structures formed in and through the first semiconductor wafer portion.

9. The memory device of claim 8, wherein the first set of interconnect structures comprises copper studs and the second set of interconnect structures comprises through-silicon vias, the first semiconductor wafer portion is flip-chip bonded to the second semiconductor wafer portion through the copper studs and the third semiconductor wafer portion is interconnected with the memory controller circuit through the through-silicon vias formed in the first semiconductor wafer portion.

10. The memory device of claim 1, wherein:
the third semiconductor component is a fourth semiconductor wafer portion comprising an application-specific logic circuit formed on the third semiconductor substrate,
wherein the application-specific logic circuit of the fourth semiconductor wafer portion is connected to the memory controller circuit through the second set of interconnect structures formed in and through the first semiconductor wafer portion.

11. The memory device of claim 10, wherein the first set of interconnect structures comprises copper studs and the second set of interconnect structures comprises through-silicon vias, the first semiconductor wafer portion is flip-chip bonded to the second semiconductor wafer portion through the copper studs and the fourth semiconductor wafer portion is interconnected with the memory controller circuit through the through-silicon vias formed in and through the first semiconductor wafer portion.

12. The memory device of claim 11, wherein input-output signals of the fourth semiconductor wafer portion is connected to the memory controller circuit of the second semiconductor wafer portion through a first array of the through-silicon vias formed in the first semiconductor wafer portion.

13. The memory device of claim 11, wherein the through-silicon vias comprise a second array of through-silicon vias formed in the first semiconductor wafer portion configured to distribute power from the memory controller circuit to the fourth semiconductor wafer.

14. The memory device of claim 10, wherein the memory controller circuit further comprises a static random-access memory (SRAM) circuit, the fourth semiconductor wafer portion being interconnected to the SRAM circuit through the second set of interconnect structures formed in the first semiconductor wafer portion and copper studs formed in and on the second semiconductor wafer portion.

15. The memory device of claim 1, wherein the third semiconductor component comprises a FPGA including programmable connections as the one or more logic bridge circuits.

16. The memory device of claim 1, wherein the data buses comprise interconnect structures selected from copper studs, hybrid bonds and through-silicon vias.

17. The memory device of claim 1, wherein each quasi-volatile memory circuit comprises a plurality of modular memory circuits ("tiles") arranged as a 2-dimensional array on the semiconductor substrate on which the quasi-volatile memory circuit is formed.

18. The memory device of claim 17, wherein the memory controller circuit comprises modular logic circuits arranged such that each modular logic circuit is positioned for interconnection by hybrid bonds with an associated one of the modular memory circuits.

19. The memory device of claim 17, wherein the tiles of each quasi-volatile memory circuits comprise a multi-layer array of memory cells.

20. The memory device of claim 1, wherein at least some of the second set of interconnect structures are configured to connect input/output signals of the third semiconductor component to the second semiconductor wafer portion to provide the input/output signals to a system external to the memory device.

* * * * *